Figure 1:
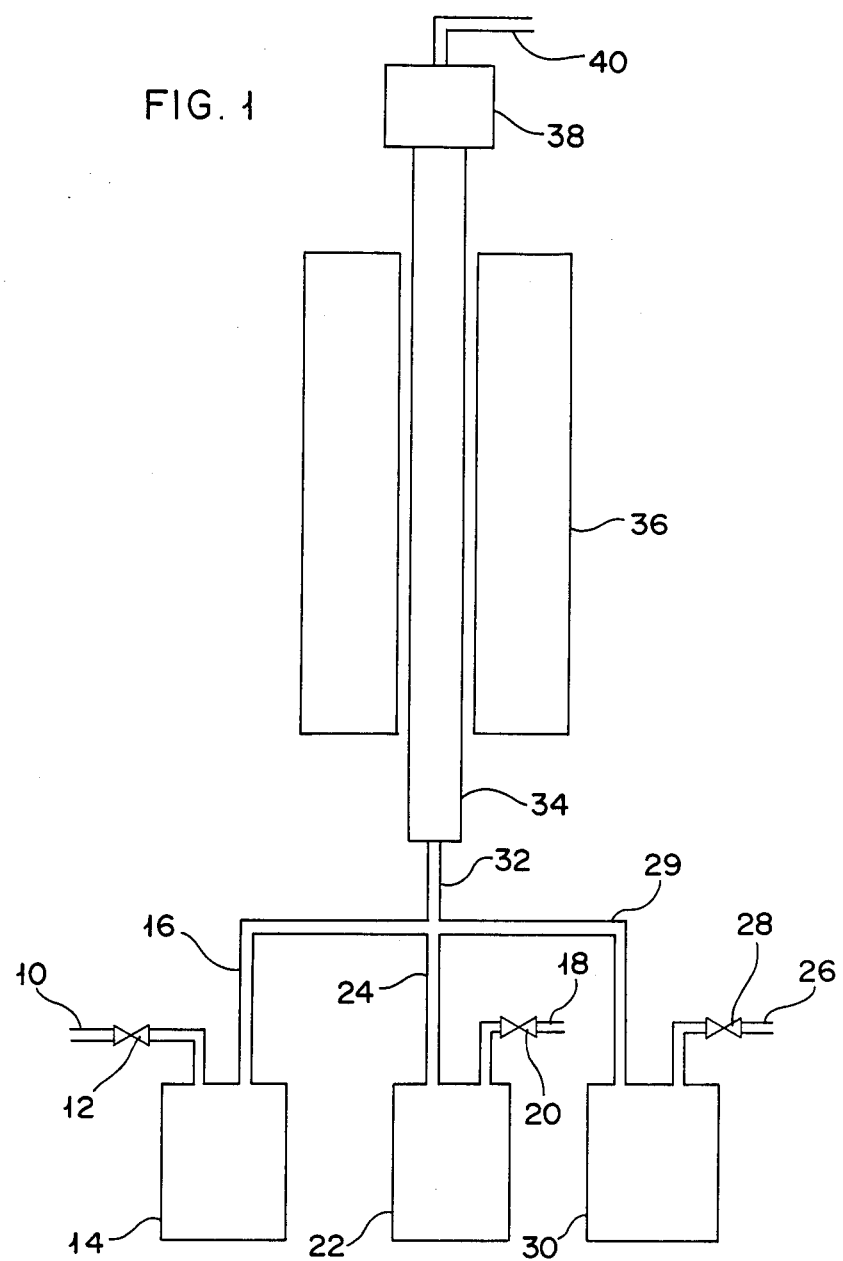

United States Patent [19]

Arakawa

[11] Patent Number: 4,640,830
[45] Date of Patent: Feb. 3, 1987

[54] PROCESS FOR PREPARING FINE FIBERS

[75] Inventor: Kohei Arakawa, Shinada, Japan

[73] Assignee: Nikkiso Co., Ltd., Tokyo, Japan

[21] Appl. No.: 774,015

[22] Filed: Sep. 9, 1985

[30] Foreign Application Priority Data

Sep. 13, 1984 [JP] Japan ................. 59-192050

[51] Int. Cl.⁴ .............................. C01B 31/36
[52] U.S. Cl. .................... 423/346; 423/345; 501/88; 501/94
[58] Field of Search ............... 423/346, 345; 501/88, 501/94

[56] References Cited

U.S. PATENT DOCUMENTS

| 3,773,899 | 11/1973 | Lewis | 423/346 |
| 3,813,340 | 5/1974 | Knippenberg et al. | 423/346 |
| 4,435,376 | 3/1984 | Porter et al. | 423/458 |
| 4,492,681 | 1/1985 | Endou et al. | 423/346 |
| 4,518,575 | 5/1985 | Porter et al. | 423/458 |
| 4,543,240 | 9/1985 | Goldberger | 501/88 |
| 4,572,813 | 2/1986 | Arakawa | 264/29.2 |

FOREIGN PATENT DOCUMENTS

| 758530Q | 5/1971 | Belgium | 423/345 |
| 57113689 | 1/1984 | Japan . | |

Primary Examiner—John Doll
Assistant Examiner—Lori S. Freeman
Attorney, Agent, or Firm—Robert R. Jackson; Paul H. Ginsburg

[57] ABSTRACT

A process for preparing fine fibers (or whiskers) consisting of carbon and silicon is disclosed, in which a mixed gas of transition metal compound(s), organo-silicon compound(s) and optionally carbon compound(s) is reacted at a high temperature, such as in the range of 700° to 1,450° C.

8 Claims, 2 Drawing Figures

PROCESS FOR PREPARING FINE FIBERS

FIELD OF THE INVENTION

This invention relates to a process for preparing fine fibers (also referred to as whiskers in the art), more particularly to a process for preparing fine fibers consisting of carbon and silicon, in which a mixed gas of transition metal compound(s), organo-silicon compound(s) and optionally carbon compound(s) is reacted at a high temperature in a heating zone.

The fine fibers or whiskers are very high in strength, modulus, heat-resistance and oxidation-resistance, and therefore very valuable as a reinforcing material for plastics, metals and others.

BACKGROUND OF THE INVENTION

Silicon carbide fibers are advantageously high in strength, modulus, heat-resistance and oxidation-resistance and therefore form a promising material as a structural material. Carbon fibers are difficult in wetting to metal, such as aluminium, and rather reactive and hence inferior to silicon carbide fibers as a reinforcing material for FRM (fiber reinforced metal). Consequently, various processes of preparing the silicon carbide fibers have been developed, including a process for preparing silicon carbide fibers by spinning and baking an organo-silicon polymer having carbon-silicon bond as a main backbone, and a process for preparing silicon carbide whiskers by means of chemical vapor deposition technique. The former is disadvantageous in that a complicated procedure of synthesis, spinning and baking of the organo-silicon polymer is needed, resulting in a high production cost. The latter process, on the other hand, has disadvantages of low productivity and poor yield, resulting also in a high production cost. In order to solve these problems, there has been developed a process for preparing silicon carbide fibers by thermally decomposing in a vapor phase the organo-silicon compound within a heating reaction zone containing fine particles of metal per se or metal compound as a seeding catalyst (Japanese Patent Application No. 113689/82). This process, however, is disadvantageous in the following operations:

(1) operation of seeding microfine metal particles onto a substrate,
(2) operation of setting the substrate in a reactor,
(3) operation of heating the reactor,
(4) reacting operation of the organo-silicon compound in the vapor phase,
(5) operation of cooling the reactor, and
(6) operation of collecting the fibers from the reactor.

These operations result in a difficult process for continuous production. Further, in such process, the reaction proceeds only on a surface of the substrate, resulting in a poor yield and hence a high production cost.

Accordingly, a general object of the invention is to provide a continuous process for preparing fine fibers of carbon and silicon, which is high in productivity and possible to reduce the production cost.

Accordingly, a general object of the invention is to provide a continuous process for preparing fine fibers of carbon and silicon, which is high in productivity and possible to reduce the production cost.

SUMMARY OF THE INVENTION

The above object may be achieved by a process for preparing fine fibers consisting of carbon and silicon in a gaseous phase reaction according to the invention, in which a gas mixture comprising a gas of transition metal compound(s), a gas of organo-silicon compound(s) and a gas of carbon compound(s) is subjected to elevated temperatures, said transition metal compound(s) at said elevated temperatures decomposing to form a metal catalyst which induces growth of said fine fibers in a floating state, and recovering said fine fibers.

Alternatively, the invention may be embodied in which a gas mixture comprising a gas of transition metal compound(s) and a gas of organo-silicon compound(s) is subjected to elevated temperatures, said transition metal compound(s) decomposing when subjected to said elevated temperatures to form a metal catalyst which induces growth of said fine fibers in a floating state, and recovering said fine fibers.

The invention will be described in more detail with reference to the prepeferred embodiments.

BRIEF DESCRIPTION OF THE INVENTION

Figure 2:
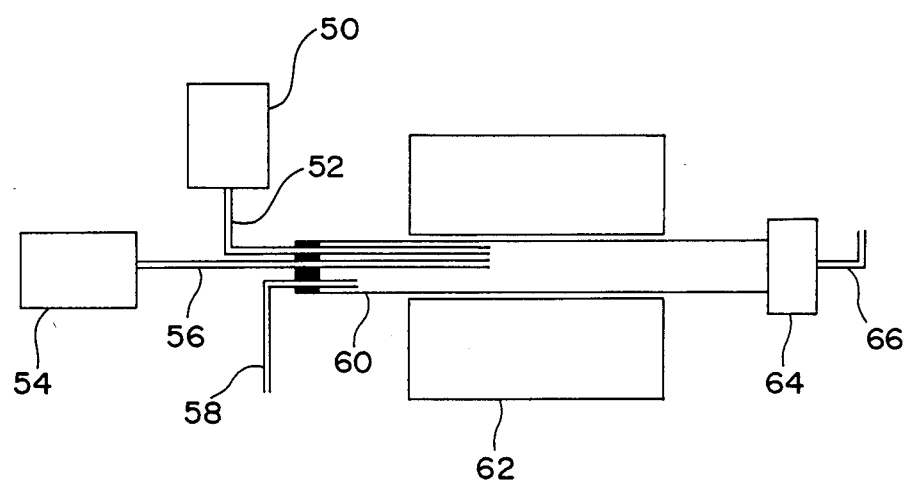

FIG. 1 is a schematic system diagram of a first and a second embodiments of the apparatus for preparing the fine fibers of carbon and silicon by the process according to the invention; and FIG. 2 is a schematic system diagram of a third embodiment of the apparatus for embodying the process according to the invention.

PREFERRED EMBODIMENTS OF THE INVENTION

The inventor has already developed a process for preparing carbon whiskers in a vapor phase growth technique in which a mixed gas of carbon compound(s), organo-transition metal compound(s) and a carrier gas is reacted at a high temperature, and filed a patent application therefor (Japanese Patent Application No. 162606/83).

The inventor has continued his study for improvement and found that incorporation of a gas of organo-silicon compounds thereinto may produce fine fibers of carbon and silicon, in stead of the carbon whiskers, in high yield and high productivity.

The carbon compound used in the invention includes any type of carbon compound usable as a carbon source, such as organic chain compounds and organic ring compounds, as well as gaseous or gasifiable carbon-containing inorganic compounds. As an example, there may be mentioned inorganic compounds, such as CO and $CS_2$, and organic compounds, especially aliphatic and aromatic hydrocarbons, such as alkanes (including methane and ethane), alkenes (including ethylene and butadiene), alkines (including acetylene), aryl hydrocarbons including benzene, toluene and styrene, aromatic compounds having condensed rings, such as indene, naphthalene and phenanthlene, cyclo-olefins including cyclopropane and cyclohexene, as well as alicyclic hydrocarbons having condensed rings, such as steroids. Of course, there may be used a mixture of more than two types of carbon compounds.

The organo-silicon compound used in the invention includes any type of organic compounds having silicon-carbon bond and silane. As the organic compound having silicon-carbon bond, there may be mentioned organo-silanes, such as tetramethylsilane and methyltriphenylsilane; organo-halogenosilanes, such as chlorodifluoromethylsilane and bromotripropylsilane; organo-alkoxysilanes, such as methoxytrimethylsilane and trimethylphenoxysilane; organoacetoxysilanes, such as diacetoxydimethylsilane and acetoxytripropylsilane; organo-polysilanes, such as hexaethyldisilane, hexaphenyldisilane and octaphenylcyclotetrasilane; organohydrogenosilanes, such as dimethylsilane and triphenylsilane; cyclosilanes represented by a formula $(SiH_2)_n$; organo-silazanes, such as triphenysilazane, hexaethyldisilazane and hexaphenylcyclotrisilazane; cyclosilazanes represented by a formula $(SiH_2NH)_n$; organosilanols, such as diethylsilanediol and triphenylsilanol; organo-silane carboxylic acids, such as trimethylsilyl acetic acid and trimethylsilyl propionic acid; silicone isocyanates, such as trimethylsilicone isocyanate and diphenylsilicone diisocyanate; organo-silicone isothiocyanates, such as trimethylsilicone isothiocyanate and diphenylsilicone diisothiocyanate; organo-silicone esters, such as triethylsilyl cyanate; silthians, such as hexamethyldisilthian and tetramethylcyclodisilthian; cyclosilthians represented by a formula $(SiH_2S)_n$; organosilmethylenes, such as hexamethyldisilmethylene and octamethyltrisilmethylene; organo-siloxanes, such as hexamethyldisiloxane and hexapropyldisiloxane. There may be used polymers or mixtures of organo-silicon compounds.

The transition metal includes scandium, titanium, vanadium, chrome, manganese, iron, cobalt, nickel, yttrium, zirconium, niobium, molybdenum, ruthenium, rhodium, palladium, tantalum, tungsten, rhenium, iridium and platinum with iron, nickel and cobalt being most effective. The transition metal compound used in the invention represents any type of compounds of said transition metal, including inorganic and organic compounds, as well as salts. Especially, such compounds may be effectively used that have a vapor pressure of not lower than 0.1 mmHg at 250 C or that are soluble in at least one carbon compound or organo-silicon compound. Many compounds of such type are known, including not only inorganic transition metal compounds, for example (1) volatile compounds, such as $FeCl_3$, $Fe(NO)_2Cl$, $Fe(NO)_2Br$, $Fe(NO)_2I$ and $FeF_3$, and (2) compounds soluble in at least one organic compound, such as $Fe(NO_3)_3$, $FeBr_3$, $Fe(HCOO)_2$, $C_{27}H_{42}FeN_9O_{12}$, $Fe_2(SO_4)_3$, $Fe(SCN)_3$, $Fe(NO)_3NH_2$, $Co(NO)_2Cl$, $Ni(NO)Cl$, $Pd(NO)_2Cl_2$ and $NiCl_2$ in addition to the compounds as listed in (1), but also any type of organic transition metal compounds, for example alkyl metals having alkyl group bonded to metal, such as $(C_4H_9)_4Ti$, $CH_2CHCH_2Mn(Co)_2$,

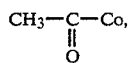

$(C_2H_5)_2FeBr$ $(C_2H_5)FeBr_2$; aryl metals having aryl group bonded to metal, such as $(C_6H_5)_3PtI$; complexes having carbon-carbon double bond or triple bond combined to metal, such as $(C_5H_5)_2Fe$, $(C_6H_6)_2Mo$, $(C_9H_7)_2Fe$, $[C_5H_5Fe(Co)_2]_2$, $[C_5H_5Fe(Co)_2]CN$,

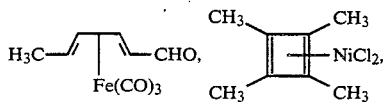

-continued

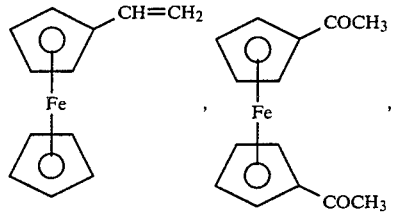

chelate compounds, such as

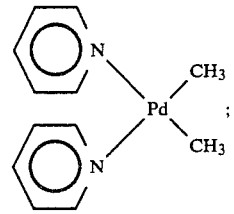

and metal carbonyls having carbonyl bonded to metal, such as $Fe(CO)_5$, $Fe_2(CO)_9$, $Ni(CO)_4$, $Cr(CO)_6$, $Mo(CO)_6$ and $W(CO)_6$. Polymers of the organic transition metal compounds may also be used. Further, mixtures of the organic and/or inorganic transition metal compounds may be of course used in the invention.

Preparation of the mixed gas in the invention may be carried out by two effective methods, but not limited thereto. In the first method, a mixed gas of a carrier gas with a gas of carbon compound(s), a mixed gas of a carrier gas with a gas of transition metal compounds(s), and a mixed gas of a carrier gas with a gas of organo-silicon compound(s) are separately prepared and then these mixed gases are combined to form a mixed gas useful in the invention. In a modification of the first method, a mixed gas of a carrier gas with a gas of transition metal compound(s) and a mixed gas of a carrier gas with organo-silicon compound(s) are separately prepared and then these mixed gases are combined to form a mixed gas useful in the invention. In the second method, on the other hand, a mixed solution of organo-silicon compound(s) having dissolved transition metal compound(s) with a solution of carbon compound(s) is vaporized to form a mixed gas of the same composition in an elemental ratio as that of the mixed solution. Alternatively, a solution of the organo-silicon compound(s) having dissolved the transition metal compound(s) may be vaporized to form a mixed gas of the same composition in an elemental ratio as that of the solution. In a further modified method, a solution of the organo-silicon compound(s) having dissolved the transition metal compound(s) is vaporized to form a mixed gas of the same composition in an elemental ratio as that of the solution, which mixed gas is then combined with a gas of carbon compound(s) to form a final mixed gas. In a still further modification, a solution of carbon compound(s) having dissolved transition metal compound(s) is vaporized to form a mixed gas of the same composition in an elemental ratio as that of the solution, which mixed gas is then combined with a gas of organo-silicon compound(s) to form a final mixed gas.

Both the first and the second methods will be described hereinbelow in more detail.

(1) The first method:

The transition metal compound(s) usable in the invention should be vaporizable by itself. The mixed gas of the invention is prepared by forming separately three mixed gases through a first means for controlling a temperature of a storing vessel of transition metal compound and feeding a carrier gas to form a mixed gas of the carrier gas with the transition metal compound gas (if the transition metal compound is gaseous, then the carrier gas may be omitted), a second means for controlling a temperature of a storing vessel of carbon compound and, feeding a carrier gas to form a mixed gas of the carrier gas with the carbon compound gas (if the carbon compound is in the gas form, then the carrier gas and the storing vessel may be omitted), and a third means for controlling a temperature of a storing vessel of organo-silicon compound and feeding a carrier gas to form a mixed gas of the carrier gas with the silicon compound gas (if the organo-silicon compound is in the gas form, then the carrier gas and the storing vessel may be omitted), and subsequently combining the three mixed gases to form a final mixed gas of the transition metal compound gas, the carbon compound gas, the organo-silicon compound gas and, if necessary, the carrier gas. If the carrier gas is omitted in the first, second and third means, it may be separately introduced to form a mixed gas of an intended composition.

(2) The second method:

In accordance with this method, a mixed solution of carbon compound and organo-silicon compound having dissolved transition metal compound is prepared, which is fed continuously to a reaction zone or a heating zone by a volumetric pump to form a mixed gas or fume of the same composition in an elemental ratio as that of the mixed solution, which gas or fume is then reacted at a high temperature. Further, this method may include several modifications, provided that one or both of the organo-silicon compound and the carbon compound can dissolve the transition metal compound. If the transition metal compound is in the liquid form, then dissolution may be omitted. Namely, in this case the transition metal compound per se may be vaporized (with or without decomposition) in the reaction zone or the heating zone.

The fibers obtained by the process according to the invention have a diameter of 0.05 to 5 μm, a length of 3 to 2000 μm and an aspect ratio of 2 to 10,000, which shape has been found to be suitable for a composite material with three reasons. Firstly, the higher aspect ratio may transmit adequate force from a matrix. Secondly, the fine configuration may avoid breakage of the fibers during a kneading operation with a matrix material and thus maintain the high aspect ratio. Thirdly, the short fiber length may avoid distortion due to a stress caused between the fiber and the matrix and thus prevent the matrix from cracking. Further, it has been found in accordance with the invention that compositional variation of the mixed gas may change composition of carbon and silicon in the product fiber.

Thus, in the mixed gas of the transition metal compound(s) with the organo-silicon compound(s) or in the mixed gas of the transition metal compound(s), the organosilicon compound(s) and the carbon compound(s), the elemental ratio of carbon and silicon therein may vary the composition of carbon and silicon in the fine fiber. Depending on the compositional ratio, the fine fiber of either a composite type of SiC with C or SiC with Si may be obtained. The compositional ratio, however, may depend on a temperature condition and chemical composition of the gases initially used, and cannot be determined only by the elemental ratio of the mixed gas. When the same gases of the transition metal compound(s), the organo-silicon compound(s) and the carbon compound(s) are employed, an increase of a partial pressure of the carbon compound gas may enhance the compositional proportion of carbon in the fine fiber. Further, it has been found that the fine fiber of the carbon-silicon carbide composite type is applicable to the matrix of both plastics and metals through control of the compositional rate.

The invention will now be described for the process of preparing silicon carbide fibers with reference to the accompanying drawings.

EXAMPLE 1

FIG. 1 shows a schematic system diagram of an experimental apparatus used in Example 1.

An alumina reactor tube 34 had an inner diameter of 52 mm, an outer diameter of 60 mm and a length of 1700 mm, over a 1000 mm length of which was extended a heater having divided three parts of equal length. The heater was covered by an electric three-circuit furnace 36, which was independently temperature-controllable, for keeping a temperature inside the reactor tube at 1,150° C. Temperature-controllable storing vessels 14, 22 and 30 were fed respectively with [(CH$_3$)$_2$Si]$_2$ (hexamethyldisilane), (C$_5$H$_5$)$_2$Fe (ferrocene), and C$_5$H$_{12}$ (cyclohexene), while a H$_2$ gas was introduced through inlet tubes 10, 18 and 26 for a carrier gas by opening valves 12, 20 and 28 respectively to prepare (1) a mixed gas of [(CH$_3$)$_3$Si]$_2$ gas with the H$_2$ gas, (2) a mixed gas of (C$_5$H$_5$)$_2$Fe gas with the H$_2$ gas and (3) a mixed gas of C$_6$H$_{12}$ gas with the H$_2$ gas. Then, these mixed gases (1)–(3) were combined through conduits 16, 24 and 29 to form a mixed gas of the [(CH$_3$)$_3$Si]$_2$ gas, the (C$_5$H$_5$)$_2$Fe gas, the C$_6$H$_{12}$ gas and the H$_2$ gas. This final mixed gas was then fed continuously into the reactor tube 34 through an inlet tube 32 for reaction at a high temperature and the waste gas was discharged from an exhaust pipe 40. The experiment was continued for two hours, and a reduced amount of each compound in the storing vessels 14, 22, 30 and a yield of a reaction product were determined. The reaction product collected in the reactor tube 34 and in a filter 38 was weighed. The result is shown in Table 1.

TABLE 1

| | |
|---|---|
| Flow Rate of H2 gas | 300 ml (25° C./atm)/min. |
| Reduced Amount of [(CH$_3$)$_3$Si]$_2$ | 6.2 g |
| Reduced Amount of (C$_5$H$_5$)$_2$Fe | 2.3 g |
| Reduced Amount of C$_6$H$_{12}$ | 2.4 g |
| Reaction Product | 2.3 g |
| Shape: | |
| diameter | 0.1–0.3 μm (95%) |
| length | 10–53 μm (95%) |
| Composition | SiC:C = 1.0:1.2 |

EXAMPLE 2

The same apparatus as in Example 1 was utilized to maintain a temperature within the reactor tube at 1,180° C. A valve 28 is closed, and the temperature-controllable storing vessels 14, 22 were fed respectively with [(CH$_3$)$_2$SiNH]$_4$ (octamethylcyclotetrasilazane) and (C$_9$H$_7$)$_2$Fe, while the H$_2$ gas was introduced through the inlet tubes 10 and 18 for the carrier gas to prepare a mixed gas of the [(CH$_3$)$_2$SiNH]$_4$ gas with the H$_2$ gas on one hand and mixed gas of the (C$_9$H$_7$)$_2$Fe gas with the $H_2$ gas on the other hand. Then, these mixed gases were further combined in the gas inlet tube 32 to form a mixed gas of the $[(CH_3)_2SiNH]_4$ gas, $(C_9H_7)_2Fe$ gas and the $H_2$ gas. This final mixed gas was introduced into the reactor tube 34 for reaction at a high temperature. The experiment was continued for two hours. The result is shown in Table 2.

TABLE 2

| | |
|---|---|
| Flow Rate of $H_2$ Gas | 400 ml(25° C./atm)min. |
| Reduced Amount of $[(CH_3)_2SiNH]_4$ | 17.3 g |
| Reduced Amount of $(C_9H_7)_2Fe$ | 4.2 g |
| Reaction Product | 3.9 g |
| Shape: | |
| diameter | 0.1–0.3 μm (95%) |
| length | 7–32 μm (95%) |
| Composition | SiC:C = 1.0:0.4 |

EXAMPLE 3

FIG. 2 shows a schematic system diagram of an experimental apparatus used in Example 3. An alumina reactor tube 60 and a heater 62 of the same types as in Example 1 was used to set a temperature in the reactor at 1,100° C. Storing vessels 50 and 54 each equipped with a pump of low flow rate were fed respectively with a solution of $C_6H_6$ having dissolved 0.1 mol/l of $(C_5H_5)_2Fe$ on one hand and a solution of $[(CH_3)_2SiNH]_3$ (hexamethylcyclotrisilazane) on the other hand. These solutions were then introduced into the reactor tube 60 through solution feed pipes 52 and 56 at flow rates of 0.1 g/min. and 0.3 g/min, respectively, by means of the equipped pumps of low flow rate [NIKKISO Infusion Pump Model P-21]. Through an inlet tube 58 for a carrier gas, was fed a mixed carrier gas which consists of $H_2$ gas and $N_2$ gas in a ratio of $H_2:N_2=1:1$ at a rate of 500 ml/min. through the reactor tube 60 for reaction at an elevated temperature and the waste gas was discharged through an exhaust pipe 66. The experiment was carried out for one hour to determine shape, yield and composition of the fine fibers formed in the reactor 60 and collected by a filter 64 (by means of X-ray diffraction analysis). The result is shown in Table 3.

TABLE 3

| | |
|---|---|
| Yield of Reaction Product | 7.6 g |
| Shape: | |
| diameter | 0.1–0.3 μm (95%) |
| length | 11–37 μm (95%) |
| Composition | SiC:C = 1.0:0.8 |

What is claimed is:

1. In a process for preparing fine fibers consisting of carbon and silicon in a gaseous phase reaction, the improvement comprising subjecting a gas mixture comprising at least one transistion metal compound gas, at least one organo-silicon compound gas and at least one carbon compound gas to an elevated temperature, said transition metal compound decomposing at the elevated temperature to form metal catalyst in a floating state which induces growth of fine fibers in a floating state, said fine fibers being continuously recovered.

2. In a process for preparing fine fibers consisting of carbon and silicon in a gaseous phase reaction, the improvement comprising subjecting a gas mixture comprising at least one transition metal compound gas and at least one organo-silicon compound gas to an elevated temperature said transition metal compound decomposing at the elevated temperature to form metal catalyst in a floating state which induces growth of fine fibers in a floating state, said fine fibers being continuously recovered.

3. A process according to claim 1 or 2 wherein the gas mixture is subjected to an elevated temperature in a reaction zone that is at a temperature in the range of 700° to 1,450° C.

4. A process according to claim 1 or 2 wherein a metal of said transition metal compoind is Fe, Ni or Co.

5. A process according to claim 1, wherein the transition metal compound is an organo-transition metal compound.

6. A process according to claim 2, wherein the transition metal compound is an organo-transition metal compound.

7. A process according to claim 3, wherein the transition metal compound is an organo-transition metal compound.

8. A process according to claim 4, wherein the transition metal compound is an organo-transition metal compound.

* * * * *